US012169978B2

(12) United States Patent
Geng et al.

(10) Patent No.: US 12,169,978 B2
(45) Date of Patent: Dec. 17, 2024

(54) PRINT RECOGNITION MODULE AND DISPLAY APPARATUS

(71) Applicants: Beijing BOE Sensor Technology Co., Ltd., Beijing (CN); BOE Technology Group Co., Ltd., Beijing (CN)

(72) Inventors: Yue Geng, Beijing (CN); Kuiyuan Wang, Beijing (CN); Zhonghuan Li, Beijing (CN); Cheng Li, Beijing (CN); Yi Dai, Beijing (CN); Yajie Feng, Beijing (CN); Chaoyang Qi, Beijing (CN); Zefei Li, Beijing (CN); Xiaoguan Li, Beijing (CN); Congcong Xi, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/038,093

(22) PCT Filed: May 27, 2021

(86) PCT No.: PCT/CN2021/096501
§ 371 (c)(1),
(2) Date: May 22, 2023

(87) PCT Pub. No.: WO2022/246757
PCT Pub. Date: Dec. 1, 2022

(65) Prior Publication Data
US 2024/0005694 A1 Jan. 4, 2024

(51) Int. Cl.
*G06V 40/13* (2022.01)
*H01L 27/146* (2006.01)

(52) U.S. Cl.
CPC ...... *G06V 40/1318* (2022.01); *G06V 40/1329* (2022.01); *H01L 27/14678* (2013.01)

(58) Field of Classification Search
CPC .......... G06V 40/1318; G06V 40/1329; G06V 10/54; H01L 27/14678
See application file for complete search history.

(56) References Cited

U.S. PATENT DOCUMENTS

2012/0050656 A1\* 3/2012 Liu ................... G02F 1/136286
349/139
2018/0069068 A1 3/2018 Ka et al.
(Continued)

FOREIGN PATENT DOCUMENTS

CN 105336751 A 2/2016
CN 106611170 A 5/2017
(Continued)

OTHER PUBLICATIONS

Machine translation of CN112420617 (Year: 2021).\*

*Primary Examiner* — Antonio Xavier
(74) *Attorney, Agent, or Firm* — ArentFox Schiff LLP; Michael Fainberg

(57) ABSTRACT

Provided in the present disclosure are a print recognition module and a display apparatus. The print recognition module includes: a base substrate; a driving circuit layer located on one side of the base substrate and including a plurality of driving transistors arranged in an array; a first insulating layer located on the side of the driving circuit layer that is away from the base substrate and including a plurality of first via holes running through the thickness thereof; a connecting electrode layer located on the side of the first insulating layer that is away from the driving circuit layer and including a plurality of connecting electrodes which are in one-to-one correspondence with first electrodes of the driving transistors; and a plurality of photoelectric conversion portions located on the side of the connecting electrode layer that is away from the first insulating layer.

16 Claims, 7 Drawing Sheets

(56) References Cited

U.S. PATENT DOCUMENTS

| | | | | |
|---|---|---|---|---|
| 2018/0150165 | A1* | 5/2018 | Kim | G06F 3/042 |
| 2018/0260058 | A1* | 9/2018 | Zhan | G02F 1/134309 |
| 2019/0005295 | A1 | 1/2019 | Jia et al. | |
| 2019/0102018 | A1 | 4/2019 | Qin et al. | |
| 2019/0205684 | A1 | 7/2019 | Liu et al. | |
| 2020/0394371 | A1* | 12/2020 | Chai | G06F 3/0416 |
| 2020/0394381 | A1* | 12/2020 | Ryu | G09G 3/3233 |
| 2021/0029318 | A1 | 1/2021 | Son et al. | |

FOREIGN PATENT DOCUMENTS

| | | |
|---|---|---|
| CN | 107632738 A | 1/2018 |
| CN | 107799567 A | 3/2018 |
| CN | 108108717 A | 6/2018 |
| CN | 110047859 A | 7/2019 |
| CN | 110838559 A | 2/2020 |
| CN | 112420617 A | 2/2021 |
| KR | 20210013508 A | 2/2021 |

* cited by examiner

PRINT RECOGNITION MODULE AND DISPLAY APPARATUS

CROSS-REFERENCE TO RELATED APPLICATIONS

The disclosure is a National Stage of International Application No. PCT/CN2021/096501, filed on May 27, 2021, which is hereby incorporated by reference in their entireties.

FIELD

The present disclosure relates to the technical field of display, in particular to a print recognition module and a display apparatus.

BACKGROUND

A thin film transistor (TFT) optical fingerprint recognition sensor panel is widely applied in the field of identity recognition due to its lower cost, simpler process, and easier large scale compared with a silicon-based lens optical sensor. Product fields that have been promoted or have great prospects for promotion include a mobile phone product, a security identity authentication, a smart door lock, and so on. Its recognition principle is as follows: a light source emits light to be irradiated onto a fingerprint, a valley and ridge of a fingerprint reflects light with different intensities, reflected light from each part of the fingerprint is irradiated onto a photosensitive pixel array of the optical fingerprint sensor panel, and then a gray scale of each part on the photosensitive pixel array is read out by a reading driver chip to achieve optical fingerprint imaging. The optical sensor panel may be integrated in the lower part of a screen to maximize an area of a screen display region, and bring a comfortable customer using experience.

However, due to an inherent defect in material, an optical fingerprint sensor may collect the residue of a previous frame of image during image collecting, resulting in image blurring and low quality of a fingerprint image. The phenomenon is more obvious especially in strong light and low temperature environments, affecting image quality and fingerprint recognition accuracy, and increasing a false accept rate. An existing fingerprint sensor module still needs to be improved to ensure the image quality and increase the fingerprint recognition accuracy.

SUMMARY

An embodiment of the present disclosure provides a print recognition module, including:
a base substrate;
a driving circuit layer on a side of the base substrate, where the driving circuit layer includes a plurality of driving transistors arranged in an array;
a first insulating layer on a side, facing away from the base substrate, of the driving circuit layer; where the first insulating layer includes a plurality of first via holes running through a thickness of the first insulating layer;
a connecting electrode layer on a side, facing away from the driving circuit layer, of the first insulating layer; where the connecting electrode layer includes a plurality of connecting electrodes which are in one-to-one correspondence with first electrodes of plurality of the driving transistors, and the plurality of connecting electrodes are electrically connected to the first electrodes of the plurality of driving transistors through the plurality of first via holes; and
a plurality of photoelectric conversion portions on a side, facing away from the first insulating layer, of the connecting electrode layer; where the plurality of photoelectric conversion portions are in correspondence with the plurality of connecting electrodes; orthographic projections of the plurality of photoelectric conversion portions on the base substrate fall within orthographic projections of the plurality of connecting electrodes on the base substrate; and surfaces of side, close to the base substrate, of the plurality of photoelectric conversion portions all come into contact with the plurality of connecting electrodes.

In some embodiments, orthographic projections of the first electrodes of the driving transistors on the base substrate cover the orthographic projections of the connecting electrodes on the base substrate.

In some embodiments, the first electrodes of the driving transistors include: first parts and second parts connected with the first parts; the orthographic projections of the connecting electrodes on the base substrate fall within orthographic projections of the first parts on the base substrate, and patterns of the orthographic projections of the connecting electrodes on the base substrate are similar to patterns of the orthographic projections of the first parts on the base substrate; and the orthographic projections of the connecting electrodes on the base substrate do not mutually overlap orthographic projections of the second parts on the base substrate.

In some embodiments, the patterns of the orthographic projections of the connecting electrodes on the base substrate are each a rectangle with a missing corner.

In some embodiments, patterns of the orthographic projections of the photoelectric conversion portions on the base substrate are similar to the patterns of the orthographic projections of the connecting electrodes on the base substrate.

In some embodiments, orthographic projections of the first via holes on the base substrate fall within the orthographic projections of the photoelectric conversion portions on the base substrate.

In some embodiments, patterns of the orthographic projections of the first via holes on the base substrate are similar to the patterns of the orthographic projections of the photoelectric conversion portions on the base substrate.

In some embodiments, a ratio of an area of the patterns of the orthographic projections of the first via holes on the base substrate to an area of the patterns of the orthographic projections of the photoelectric conversion portions on the base substrate ranges from 0.6:1 to 1:1.

In some embodiments, the driving circuit layer specifically includes:
a first conductive layer, including control electrodes of the driving transistors and a plurality of scanning signal lines;
a gate insulating layer on a side, facing away from the base substrate, of the first conductive layer;
an active layer on a side, facing away from the first conductive layer, of the gate insulating layer; and
a second conductive layer on a side, facing away from the gate insulating layer, of the active layer; where the second conductive layer includes: the first electrodes and second electrodes of the plurality of driving transistors, and a plurality of data signal lines; the data signal lines and the scanning signal lines cross each other to divide into a plurality of print recognition units; the first electrode of each driving transistor is located in the corresponding print recognition unit; a minimum distance between an edge of an orthographic projection of the first electrode of each driving transistor on the base substrate and an edge of an orthographic projection of the corresponding scanning signal line on the base substrate is greater than or equal to 3 microns and less than or equal to 5 microns; and a minimum distance between the edge of the orthographic projection of the first electrode of each driving transistor on the base substrate and an edge of an orthographic projection of the corresponding data signal line on the base substrate is greater than or equal to 3 microns and less than or equal to 5 microns.

In some embodiments, a minimum distance between an edge of the orthographic projection of each connecting electrode on the base substrate and the edge of the orthographic projection of the corresponding scanning signal line on the base substrate is greater than or equal to 8 microns and less than or equal to 10 microns, and a minimum distance between the edge of the orthographic projection of each connecting electrode on the base substrate and the edge of the orthographic projection of the corresponding data signal line on the base substrate is greater than or equal to 8 microns and less than or equal to 10 microns.

In some embodiments, in each print recognition unit, the first via hole and the driving transistor are arranged oppositely in an extension direction of a diagonal line of the print recognition unit.

In some embodiments, in each print recognition unit, the first via hole and the driving transistor are arranged oppositely in an extension direction of the scanning signal lines.

In some embodiments, a ratio of an area of the orthographic projections of the first via holes on the base substrate to the area of the orthographic projections of the photoelectric conversion portions on the base substrate ranges from 0.005:1 to 0.05:1.

In some embodiments, a ratio of the area of the orthographic projections of the photoelectric conversion portions on the base substrate to the area of the orthographic projections of the connecting electrodes on the base substrate ranges from 0.6:1 to 1:1.

In some embodiments, the orthographic projections of the first electrodes of the driving transistors on the base substrate cover the orthographic projections of the connecting electrodes on the base substrate.

In some embodiments, a ratio of an area of the orthographic projections of the connecting electrodes on the base substrate to an area of the orthographic projections of the first electrodes of the driving transistors on the base substrate ranges from 0.6:1 to 1:1.

In some embodiments, the print recognition module further includes:
   a first buffer layer on sides, facing away from the connecting electrode layer, of the plurality of photoelectric conversion portions;
   a planarization layer on a side, facing away from the plurality of photoelectric conversion portions, of the first buffer layer;
   a second buffer layer on a side, facing away from the first buffer layer, of the planarization layer;
   a third conductive layer on a side, facing away from the planarization layer, of the second buffer layer; where the third conductive layer comes into contact with the plurality of photoelectric conversion portions through a plurality of second via holes running through the second buffer layer, the planarization layer, and the first buffer layer;
   a second insulating layer on a side, facing away from the second buffer layer, of the third conductive layer;
   a light-shading metal layer on a side, facing away from the third conductive layer, of the second insulating layer; where an orthographic projection of the light-shading metal layer on the base substrate covers orthographic projections of active layers of the plurality of driving transistors on the base substrate;
   a third insulating layer on a side, facing away from the second insulating layer, of the light-shading metal layer; where the third insulating layer has a third via hole running through a thickness of the third insulating layer; and
   a shielding layer on a side, facing away from the light-shading metal layer, of the third insulating layer, where the shielding layer comes into contact with the light-shading metal layer through the third via hole.

In some embodiments, the plurality of second via holes completely expose surfaces of sides, facing away from the plurality of connecting electrodes, of the plurality of photoelectric conversion portions.

A display apparatus provided by an embodiment of the present disclosure includes the print recognition module provided by the embodiments of the present disclosure, and a display panel on a side of the print recognition module.

BRIEF DESCRIPTION OF THE DRAWINGS

In order to illustrate the technical solutions in the embodiments of the present disclosure more clearly, accompanying drawings needing to be used in description of the embodiments will be introduced below briefly. Apparently, the accompanying drawings in the description below are only some embodiments of the present disclosure, those ordinarily skilled in the art can further obtain other accompanying drawings according to these accompanying drawings without inventive efforts.

DETAILED DESCRIPTION OF THE EMBODIMENTS

In order to make objectives, technical solutions and advantages of embodiments of the present disclosure clearer, the technical solutions of the embodiments of the present disclosure will be described clearly and completely with reference to accompanying drawings of the embodiments of the present disclosure. Apparently, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by those ordinarily skilled in the art without inventive efforts fall within the scope of protection of the present disclosure.

Unless otherwise defined, the technical or scientific terms used in the present disclosure shall have the usual meanings understood by a person of ordinary skill in the art to which the present disclosure belongs. "First", "second" and similar words used in the present disclosure do not indicate any order, quantity or importance, but are only used to distinguish different components. "Including" or "containing" and similar words, mean that an element or item preceding the word covers an element or item listed after the word and the equivalent thereof, without excluding other elements or items. "Connection" or "coupling" and similar words are not limited to physical or mechanical connection, but may include electrical connection, whether direct or indirect.

It should be noted that sizes and shapes of all graphs in the accompanying drawings do not reflect the true scale, and only intend to illustrate the content of the present disclosure. The same or similar reference numbers represent the same or similar elements or elements with the same or similar functions from beginning to end.

Figure 1:
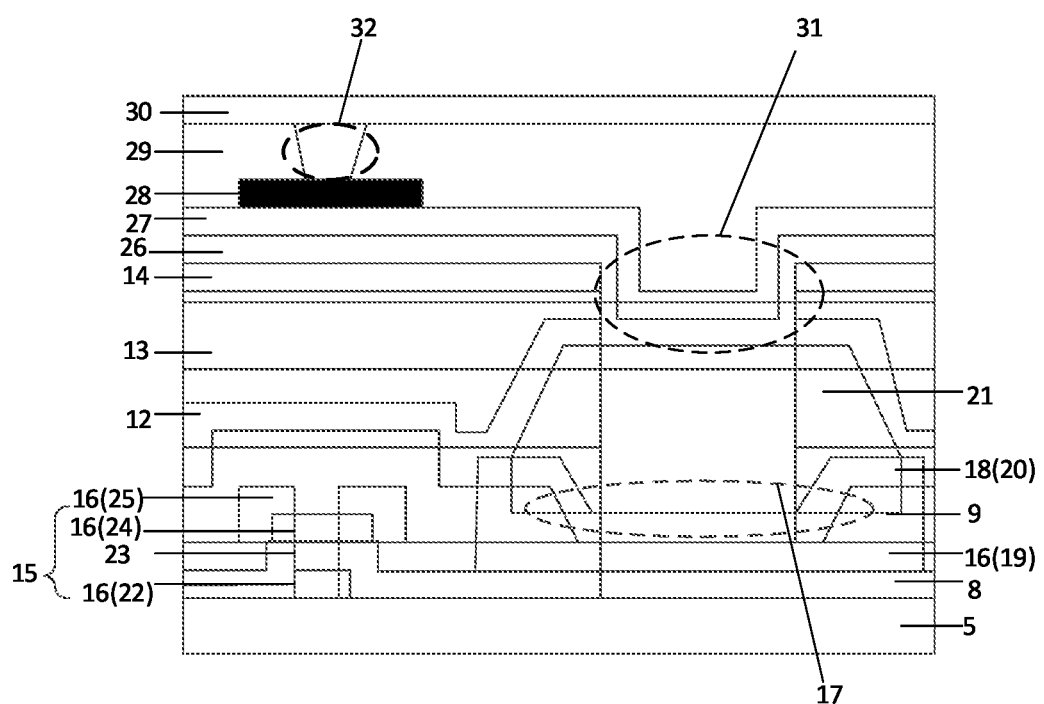
FIG. 1 is a schematic structural diagram of a print recognition module provided by an embodiment of the present disclosure.

Embodiments of the present disclosure provide a print recognition module, as shown in FIG. 1, including:

a base substrate 5;

a driving circuit layer 15 on a side of the base substrate 5; where the driving circuit layer 15 includes a plurality of driving transistors 16 arranged in an array;

a first insulating layer 9 on a side, facing away from the base substrate 5, of the driving circuit layer 15; where the first insulating layer 9 includes a plurality of first via holes 17 running through a thickness of the first insulating layer 9;

a connecting electrode layer 18 on a side, facing away from the driving circuit layer of the first insulating layer 9; where the connecting electrode layer 18 includes a plurality of connecting electrodes 20 which are in one-to-one correspondence with first electrodes 19 of the driving transistors 16, and the connecting electrodes 20 are electrically connected to the first electrodes 19 of the driving transistors 16 through the first via holes 17; and a plurality of photoelectric conversion portions 21 on a side, facing away from the first insulating layer 9, of the connecting electrode layer 18; where the plurality of photoelectric conversion portions 21 are in correspondence with the connecting electrodes 20; orthographic projections of the photoelectric conversion portions 21 on the base substrate 5 fall within orthographic projections of the connecting electrodes 20 on the base substrate 5; and surfaces of sides, close to the base substrate 5, of the photoelectric conversion portions 21 all come into contact with the connecting electrodes 20.

According to the print recognition module provided by the embodiments of the present disclosure, the connecting electrodes electrically connected to the first electrodes of the driving transistors are additionally arranged between the photoelectric conversion portions and the first insulating layer, the connecting electrodes come into contact with the photoelectric conversion portions, and the connecting electrodes are each equivalent to a bottom electrode of a photodiode. Moreover, in a case that the orthographic projections of the photoelectric conversion portions on the base substrate fall within the orthographic projections of the connecting electrodes on the base substrate, the surfaces of sides, close to the base substrate, of the photoelectric conversion portions all come into contact with the connecting electrodes, that is, there is no region of indirect contact between the photoelectric conversion portions and the connecting electrodes, thereby avoiding loss of an electric field directly facing edges of the photoelectric conversion portions. When the print recognition module is applied to a display product, even if a sufficient number of photogenerated carriers accumulate due to light leakage at a bottom of a display panel of the display product, since the surfaces of sides, close to the base substrate, of the photoelectric conversion portions of the print recognition module provided by the present application all come into contact with the connecting electrodes, an electric field range of the photoelectric conversion portions is increased and a movement speed of the carriers on side walls of the photoelectric conversion portions is increased compared with the prior art, so as to reduce a probability of the photogenerated carriers being captured by the defect state, reduce the residue of a previous frame of image, and further reduce a difficulty of removing the carriers captured by the side wall defect of the photoelectric conversion portions, avoiding image residue, and thereby improving accuracy of print recognition.

It should be noted that the print recognition module provided by the embodiments of the present disclosure is an optical print recognition module that can recognize lines such as a fingerprint and a palm print.

Figure 2:
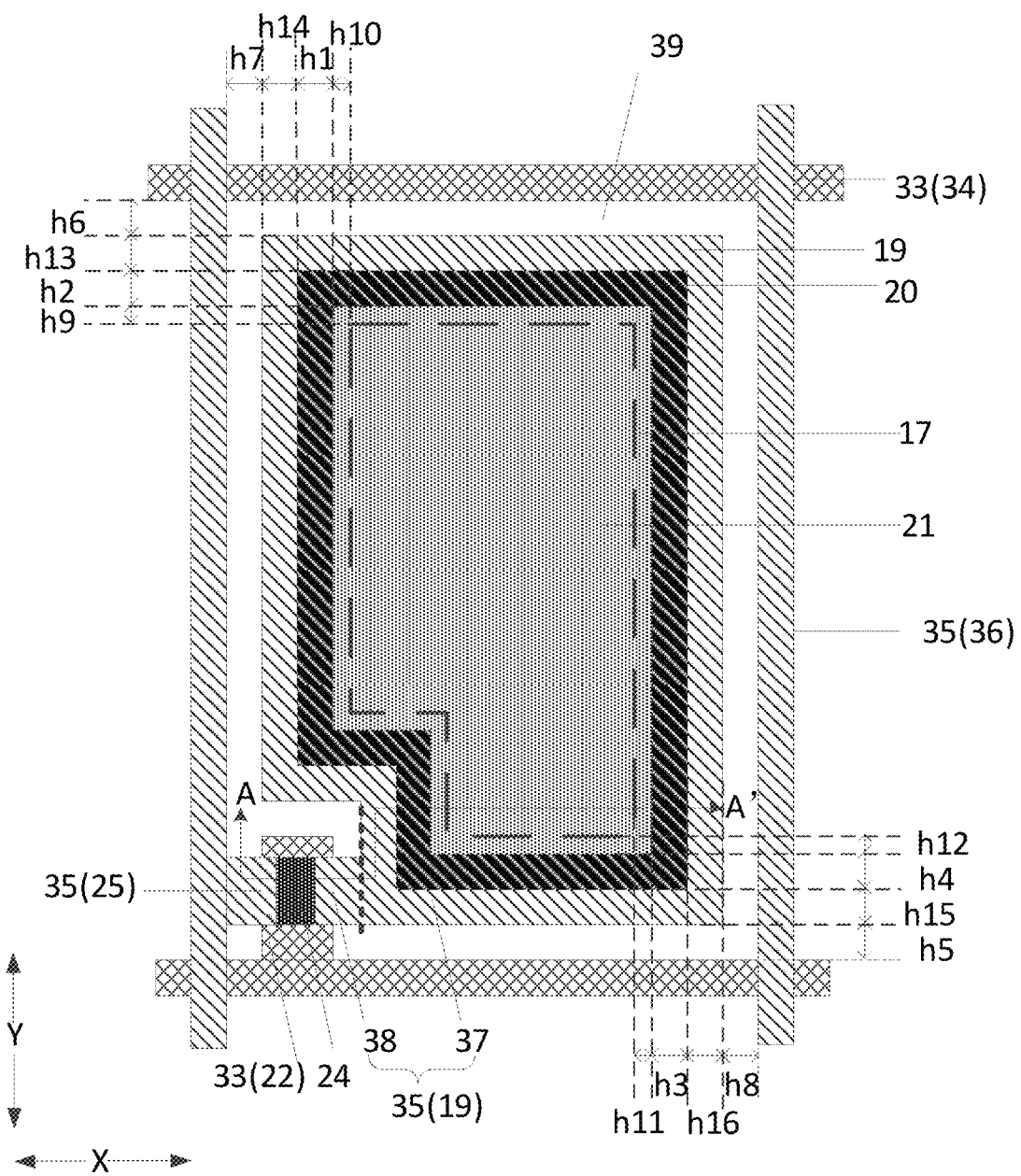
FIG. 2 is a top view of a print recognition module provided by an embodiment of the present disclosure.

In some embodiments, as shown in FIG. 1 and FIG. 2, the driving circuit layer 15 specifically includes:

a first conductive layer 33, including control electrodes 22 of the driving transistors 16 and a plurality of scanning signal lines 34;

a gate insulating layer 8 on a side, facing away from the base substrate 5, of the first conductive layer 33;

an active layer 24 on a side, facing away from the first conductive layer 33, of the gate insulating layer 8; and a second conductive layer 35 on a side, facing away from the gate insulating layer 8, of the active layer 24; where the second conductive layer 35 includes: the first electrodes 19 and second electrodes 25 of the driving transistors, and a plurality of data signal lines 36; the data signal lines 36 and the scanning signal lines 34 cross each other to divide into a plurality of print recognition units 39; and the first electrode 19 of each driving transistor is located in the corresponding print recognition unit 39.

It should be noted that FIG. 2 only shows one print recognition unit. FIG. 1 may be, for example, a sectional view along AA' in FIG. 2. FIG. 1 and FIG. 2 take an example that the driving transistors each are a bottom gate structure for illustration. Certainly, during specific implementation, each driving transistor may also be a top gate structure, that is, the active layer is located between the control electrodes and the base substrate. FIG. 2 takes an example that the scanning signal lines 34 extend in a first direction X and the data signal lines 36 extend in a second direction Y for distance illustration. The first direction X is perpendicular to the second direction Y.

In some embodiments, minimum distances h5 and h6 between edges of the first electrode of the driving transistor and the scanning signal lines are within a range from 3 microns to 5 microns, and minimum distances h7 and h8 between the edges of the first electrode of the driving transistor and the data signal lines are greater than or equal to 3 microns and less than or equal to 5 microns.

In some embodiments, h5=h6=h7=h8.

In some embodiments, as shown in FIG. 2, orthographic projections of the first electrodes 19 of the driving transistors on the base substrate cover the orthographic projections of the connecting electrodes 20 on the base substrate.

In some embodiments, as shown in FIG. 2, the first electrodes 19 of the driving transistors include: first parts 37 and second parts 38 connected with the first parts 37; the orthographic projections of the connecting electrodes 20 on the base substrate 5 fall within orthographic projections of the first parts 37 on the base substrate 5, and patterns of the orthographic projections of the connecting electrodes 20 on the base substrate 5 are similar to patterns of the orthographic projections of the first parts 37 on the base substrate 5; and the orthographic projections of the connecting electrodes on the base substrate do not mutually overlap orthographic projections of the second parts on the base substrate.

According to the print recognition module provided by the embodiments of the present disclosure, the orthographic projections of the connecting electrodes on the base substrate fall within the orthographic projections of the first electrodes of the driving transistors on the base substrate, thereby avoiding generation of a large parasitic capacitance due to a close distance between the connection electrode and the data signal line as well as the scanning signal line, and avoiding line noise deterioration of the print recognition module. Thus, sensitivity and accuracy of the print recognition module for print recognition can be improved.

In some embodiments, a ratio of an area of the orthographic projections of the connecting electrodes on the base substrate to an area of the orthographic projections of the first electrodes of the driving transistors on the base substrate ranges from 0.6:1 to 1:1.

In some embodiments, distances h13, h14, h15 and h16 between edges of the orthographic projection of the connecting electrode on the base substrate and edges of the orthographic projection of the first electrode on the base substrate are less than or equal to 5 microns.

In some embodiments, h13=h14=h15=h16.

In some embodiments, a minimum distance between an edge of the orthographic projection of each connecting electrode on the base substrate and the edge of the orthographic projection of the corresponding scanning signal line on the base substrate is greater than or equal to 8 microns and less than or equal to 10 microns, and a minimum distance between an edge of the orthographic projection of each connecting electrode on the base substrate and an edge of the orthographic projection of the corresponding data signal line on the base substrate is greater than or equal to 8 microns and less than or equal to 10 microns.

In some embodiments, as shown in FIG. 2, patterns of the orthographic projections of the photoelectric conversion portions 21 on the base substrate are similar to the patterns of the orthographic projections of the connecting electrodes 20 on the base substrate.

In some embodiments, a ratio of the area of the orthographic projections of the photoelectric conversion portions on the base substrate to the area of the orthographic projections of the connecting electrodes on the base substrate ranges from 0.6:1 to 1:1.

In some embodiments, distances h1, h2, h3 and h4 between edges of the orthographic projection of the photoelectric conversion portion on the base substrate and the edges of the orthographic projection of the connecting electrode on the base substrate are less than or equal to 5 microns.

In some embodiments, h1=h2=h3=h4.

In some embodiments, as shown in FIG. 2, the orthographic projection of the first via hole 17 on the base substrate falls within the orthographic projection of the photoelectric conversion portion 21 on the base substrate.

It should be noted that FIG. 2 does not show the first insulating layer, but only shows a region of the first via hole by a dotted line.

In some embodiments, as shown in FIG. 2, a pattern of the orthographic projection of the first via hole 17 on the base substrate is similar to the pattern of the orthographic projection of the photoelectric conversion portion 21 on the base substrate.

According to the print recognition module provided by the embodiments of the present disclosure, the patterns of the orthographic projections of the first via holes on the base substrate are similar to the patterns of the orthographic projections of the photoelectric conversion portions on the base substrate, which can make an area of the first via holes running through the first insulating layer be greater, thereby increasing a contact area between the connecting electrodes and the first electrodes of the driving transistors, and further improving a signal transmission effect.

In some embodiments, a ratio of an area of the patterns of the orthographic projections of the first via holes on the base substrate to an area of the patterns of the orthographic projections of the photoelectric conversion portions on the base substrate ranges from 0.6:1 to 1:1.

In some embodiments, as shown in FIG. 2, a pattern of the connecting electrode on the base substrate is a rectangle with a missing corner.

It should be noted that, as shown in FIG. 2, the pattern of the connecting electrode is the rectangle with the missing corner, and a corner missing part is still a rectangular. During specific implementation, the corner missing part may also be other shapes, such as a fan shape, a triangle, or a polygon more than a quadrangle.

Certainly, during specific implementation, the patterns of the connecting electrodes may also be other shapes. The patterns of the connecting electrodes may be specifically designed according to the patterns of the first electrodes of the driving transistors.

In some embodiments, as shown in FIG. 2, the pattern of the first part 37 of the first electrode 19, the pattern of the connecting electrode, the pattern of the photoelectric conversion portion 21, and the pattern of the first via hole 17 are all similar. That is, the pattern of the first part 37 of the first electrode 19, the pattern of the connecting electrode, the pattern of the photoelectric conversion portion 21, and the pattern of the first via hole 17 are each a rectangle with a missing corner.

In some embodiments, as shown in FIG. 2, minimum distances h9, h10, h11 and h12 between edges of the pattern of the orthographic projection of the first via hole on the base substrate and the edges of the pattern of the orthographic projection of the photoelectric conversion part on the base substrate are less than or equal to 5 microns.

Figure 3:
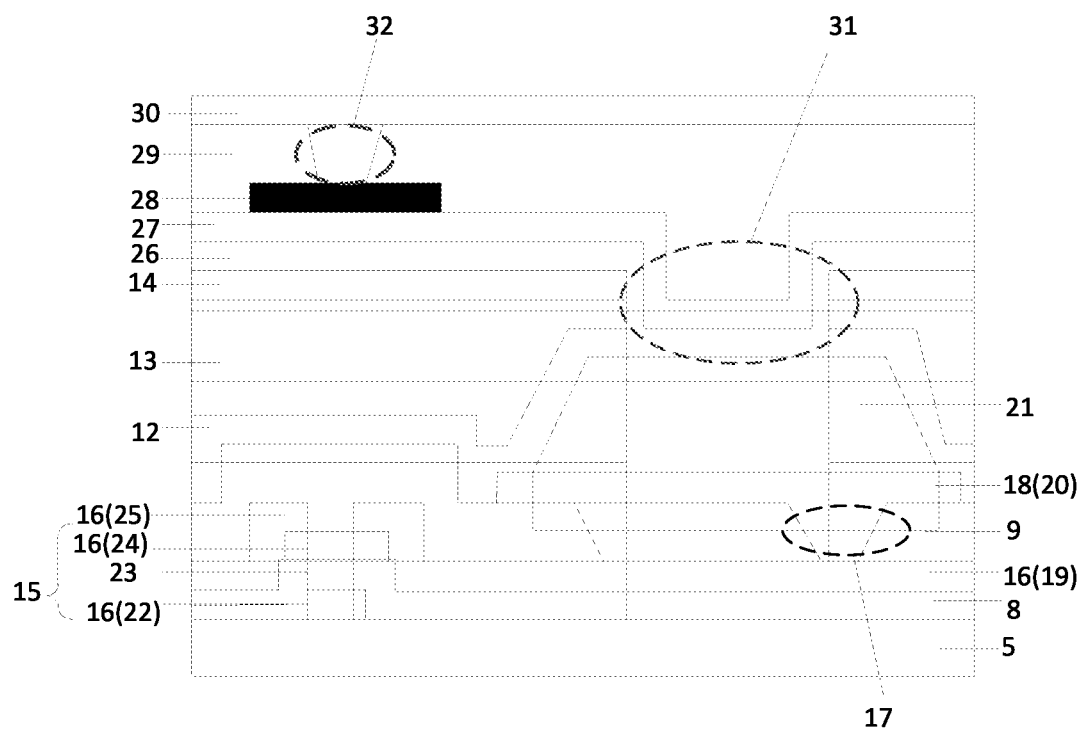
FIG. 3 is a schematic structural diagram of another print recognition module provided by an embodiment of the present disclosure.
Figure 4:
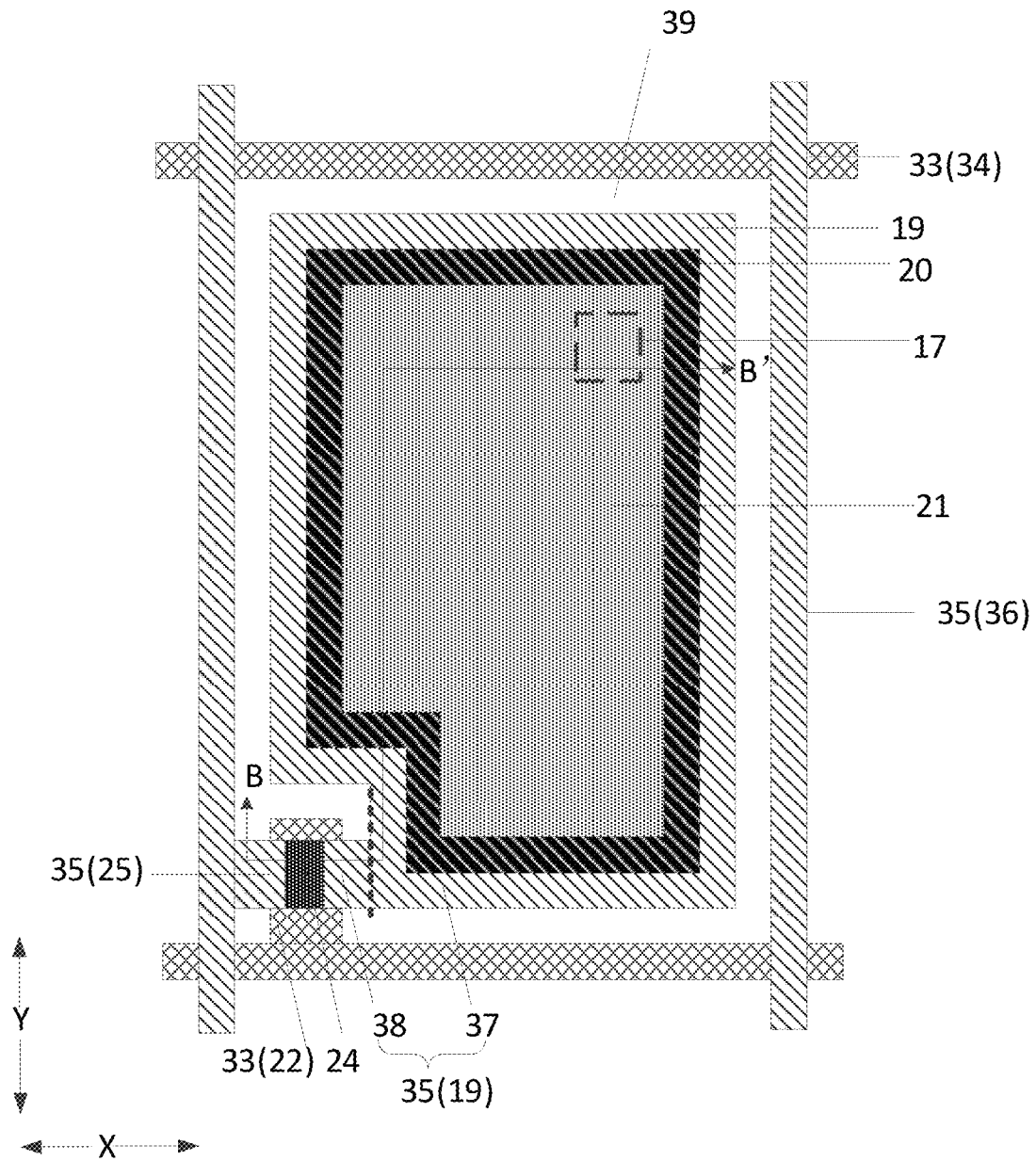
FIG. 4 is a top view of another print recognition module provided by an embodiment of the present disclosure.
Figure 5:
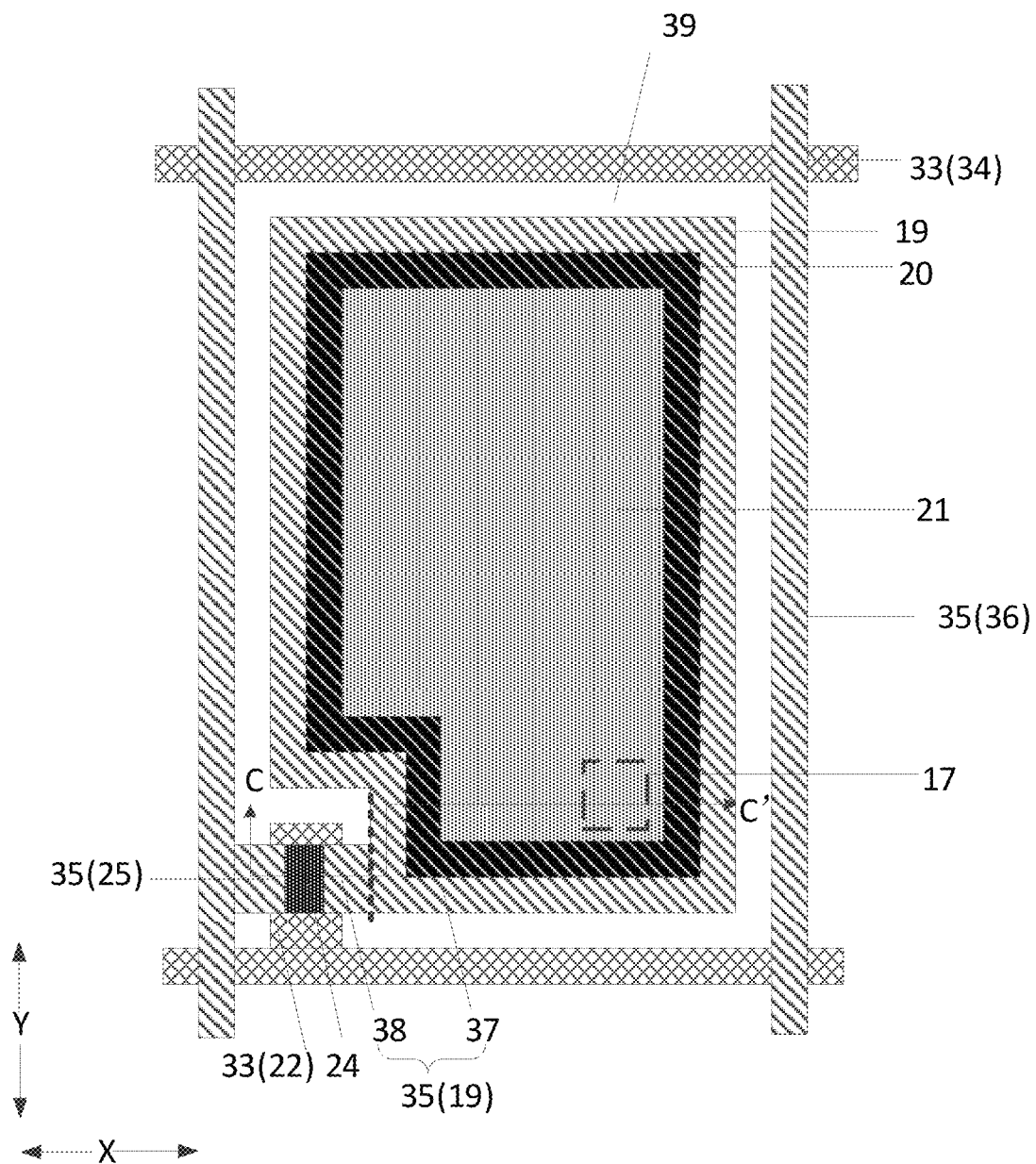
FIG. 5 is a top view of yet another print recognition module provided by an embodiment of the present disclosure.

Certainly, in some embodiments, as shown in FIG. 3, FIG. 4, and FIG. 5, the first via holes 17 may be designed as small holes, thereby reducing a process difficulty of forming the first via holes in the insulating layer.

It should be noted that FIG. 3 may be, for example, a sectional view along BB' in FIG. 4 or CC' in FIG. 5.

In some embodiments, when the first via holes are designed as the small holes, a ratio of an area of the orthographic projections of the first via holes on the base substrate to the area of the orthographic projections of the photoelectric conversion portions on the base substrate ranges from 0.005:1 to 0.05:1.

In some embodiments, when the first via holes are designed as the small holes, the area of each first via hole is, for example, greater than or equal to 5 microns and less than or equal to 10 microns.

When the first via holes are designed as the small holes, the patterns of the orthographic projections of the first via holes on the base substrate may be circles, rectangles, and other shapes.

In some embodiments, as shown in FIG. 4, in each print recognition unit 39, the first via hole 17 and the driving transistor are arranged oppositely in an extension direction of a diagonal line of the print recognition unit 39. That is, the first via hole and the driving transistor are respectively arranged at opposite corners of the pattern recognition unit.

Certainly, the first via hole and the driving transistor are respectively arranged at adjacent corners of the pattern recognition unit.

In some embodiments, as shown in FIG. 5, in each print recognition unit 39, the first via hole 17 and the driving transistor are arranged oppositely in an extension direction of the scanning signal lines 34. As shown in FIG. 5, the scanning signal line 34 closest to the first via hole 17 and the scanning signal line 34 closest to the driving transistor are the same scanning signal line 34.

Certainly, when the first via holes are designed as the small holes, the first via holes may also be arranged in other positions.

In some embodiments, as shown in FIG. 1 and FIG. 3, the print recognition module further includes:
- a first buffer layer 12 on sides, facing away from the connecting electrode layer 18, of the photoelectric conversion portions 21;
- a planarization layer 13 on a side, facing away from the photoelectric conversion portions 21, of the first buffer layer 12;
- a second buffer layer 14 on a side, facing away from the first buffer layer 12, of the planarization layer 13;
- a third conductive layer 26 on a side, facing away from the planarization layer 13, of the second buffer layer 14; wherein the third conductive layer 26 comes into contact with the photoelectric conversion portions 21 through a plurality of second via holes 31 running through the second buffer layer 14, the planarization layer 13, and the first buffer layer 12;
- a second insulating layer 27 on a side, facing away from the second buffer layer 14, of the third conductive layer 26;
- a light-shading metal layer 28 on a side, facing away from the third conductive layer 26, of the second insulating layer 27; where an orthographic projection of the light-shading metal layer 28 on the base substrate 5 covers orthographic projections of active layers 24 of the driving transistors 16 on the base substrate 5;
- a third insulating layer 29 on a side, facing away from the second insulating layer 27, of the light-shading metal layer 28; where the third insulating layer 29 has a third via hole 32 running through a thickness of the third insulating layer 29; and
- a shielding layer 30 on a side, facing away from the light-shading metal layer 28, of the third insulating layer 29, where the shielding layer 30 comes into contact with the light-shading metal layer 28 through the third via hole 32.

It should be noted that in the print recognition module provided by the embodiments of the present disclosure, a photodiode is formed by the connecting electrode, the photoelectric conversion portion, and a third electrode layer. In some embodiments, as shown in FIG. 1 and FIG. 3, the third conductive layer 26 may be arranged as a whole layer to provide a reference voltage signal.

In some embodiments, the driving transistor may be, for example, a thin film transistor. Materials of the control electrode, the first electrode and the second electrode of the driving transistor, and materials of the connecting electrode and the light-shading metal layer may be, for example, aluminum, molybdenum, copper and other metal materials. The photoelectric conversion portion includes the semiconductor material doped with electronic/intrinsic/hole, such as amorphous silicon (a-Si) and polycrystalline silicon (p-Si) doped with p-i-n. The material of the active layer of the driving transistor may be, for example, amorphous silicon, polycrystalline silicon, an indium gallium zinc oxide (IGZO), and the like; and materials of the gate insulating layer, the first insulating layer, the first buffer layer, the second buffer layer, and the second insulating layer may be, for example, silicon nitride, silicon oxide, and the like. A material of the planarization layer includes, for example, resin. The role of the first buffer layer is to optimize a contact morphology of the planarization layer and layers below it. The role of the planarization layer is to planarize a segment difference of a film layer caused by deposition and etching of the photoelectric conversion portions, ensuring that the film layers on it do not break due to the gradient of the segment difference. The role of the second buffer layer is to optimize a contact morphology of the planarization layer and layers above it. The third conductive layer serves as the other electrode of the PIN junction photodiode, and a material of the third conductive layer is a transparent conductive material, such as indium tin oxide. The role of the second insulating layer is to isolate electrical lap joint between the light-shading metal layer and the third conductive layer. The light-shading metal layer is an opaque metal layer, which prevents light from irradiating a channel region of the driving transistor so as to prevent the active layer from generating a large leakage current when exposed to the light. The third insulating layer is a thicker layer of silicon oxide or silicon nitride thin film compared with other insulating layers, which ensures that the print recognition module has a certain surface scratch resistance strength. The shielding layer is a transparent conductive thin film, and the material of the shielding layer includes, for example, indium tin oxide and the like. When the print recognition module provided by the embodiments of the present disclosure is applied to the display product, the shielding layer may shield signal lines of the display panel from causing crosstalk to the print recognition module.

Figure 6:
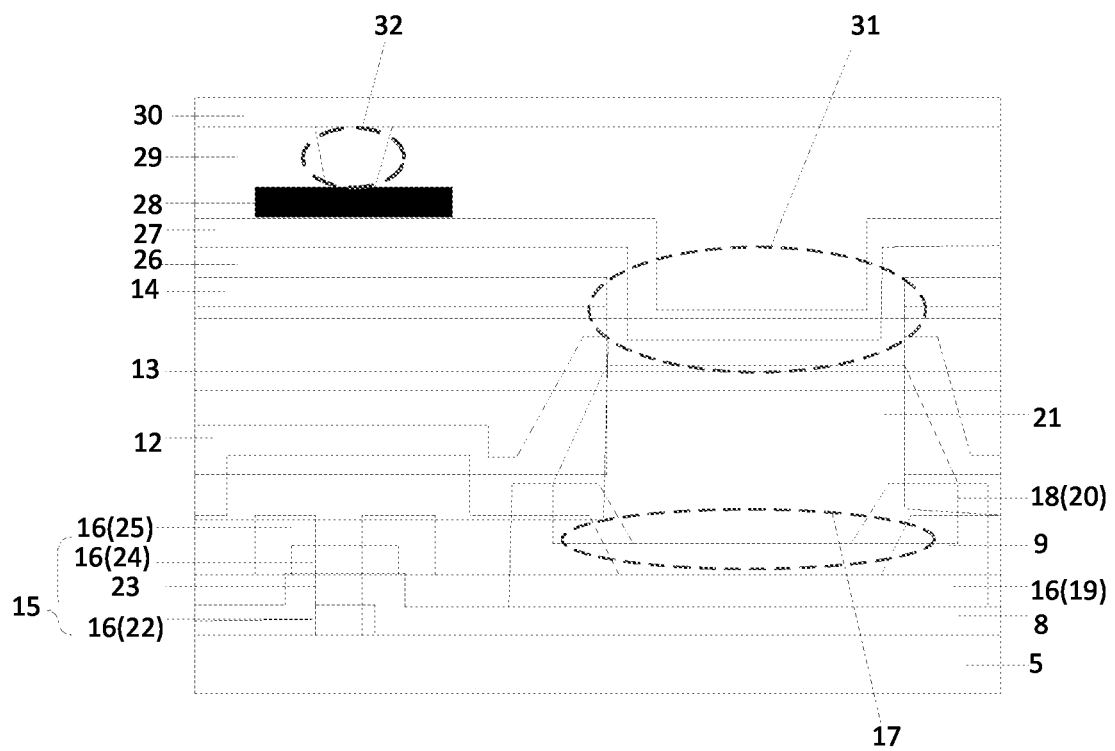
FIG. 6 is a schematic structural diagram of yet another print recognition module provided by an embodiment of the present disclosure.

In some embodiments, as shown in FIG. 6, the second via hole 31 completely exposes the surfaces of a side, facing away from the connecting electrode 20, of the photoelectric conversion portion 21.

That is, the surfaces of sides, facing away from the base substrate, of the photoelectric conversion portions fully come into contact with the third electrode layer, which can further avoid the loss of the electric field directly facing the edges of the photoelectric conversion portions, reduce the difficulty of removing the carriers captured by the side wall defect of the photoelectric conversion portions, and avoid image residue, thereby improving the accuracy of print recognition.

Figure 7:
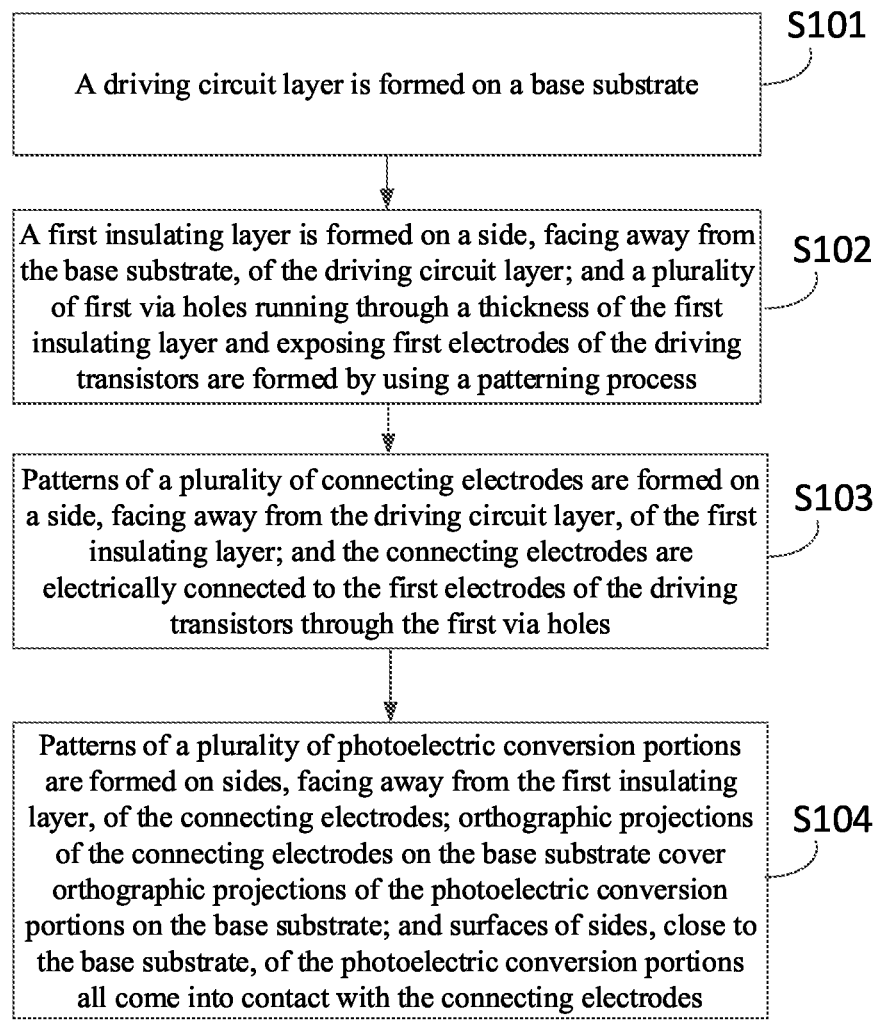
FIG. 7 is a schematic flow diagram of a preparation method of a print recognition module provided by an embodiment of the present disclosure.

Based on the same inventive concept, embodiments of the present disclosure further provide a preparation method of a print recognition module, as shown in FIG. 7, including the following.

S101, a driving circuit layer is formed on a base substrate, where the driving circuit layer includes a plurality of driving transistors arranged in an array.

S102, a first insulating layer is formed on a side, facing away from the base substrate, of the driving circuit layer; and a plurality of first via holes running through a thickness of the first insulating layer and exposing first electrodes of the driving transistors are formed by using a patterning process.

S103, patterns of a plurality of connecting electrodes are formed on a side, facing away from the driving circuit layer, of the first insulating layer; and the connecting electrodes are electrically connected to the first electrodes of the driving transistors through the first via holes.

S104, patterns of a plurality of photoelectric conversion portions are formed on sides, facing away from the first insulating layer, of the connecting electrodes; orthographic projections of the connecting electrodes on the base substrate cover orthographic projections of the photoelectric conversion portions on the base substrate; and surfaces of sides, close to the base substrate, of the photoelectric conversion portions all come into contact with the connecting electrodes.

According to the preparation method of the print recognition module provided by the embodiments of the present disclosure, after forming the first insulating layer, the connecting electrodes electrically connected to the first electrodes of the driving transistors are formed, the subsequently formed photoelectric conversion portions come into contact with the connecting electrodes, and the connecting electrodes are each equivalent to a bottom electrode of a photodiode. Moreover, in a case that the orthographic projections of the photoelectric conversion portions on the base substrate fall within the orthographic projections of the connecting electrodes on the base substrate, the surfaces of sides, close to the base substrate, of the photoelectric conversion portions all come into contact with the connecting electrodes, that is, there is no region of indirect contact between the photoelectric conversion portions and the connecting electrodes, thereby avoiding loss of an electric field directly facing edges of the photoelectric conversion portions, reducing the difficulty of removing the carriers captured by the side wall defect of the photoelectric conversion portions, avoiding image residue, and further improving the accuracy of print recognition.

In some embodiments, the forming the driving circuit layer on the base substrate specifically includes:
forming a first conductive layer on the base substrate, and forming patterns of control electrodes of the driving transistors and patterns of scanning signal lines by using a patterning process on the first conductive layer;
forming a pattern of a gate insulating layer on the first conductive layer;
forming patterns of active layers on the gate insulating layer; and
forming a second conductive layer on the active layers, and forming patterns of first electrodes and patterns of second electrodes of the driving transistors and patterns of data signal lines by using the patterning process on the second conductive layer.

In some embodiments, after forming the patterns of the plurality of photoelectric conversion portions, the method further includes:
forming a first buffer layer, a planarization layer, a second buffer layer, a third conductive layer, a second insulating layer, a light-shading metal layer, a third insulating layer, and a shielding layer in sequence;
where the third conductive layer comes into contact with the photoelectric conversion portions through a plurality of second via holes running through the second buffer layer, the planarization layer, and the first buffer layer; the second via holes fully expose the surfaces of sides, facing away from the connecting electrodes, of the photoelectric conversion portions; and an orthographic projection of the light-shading metal layer on the base substrate covers orthographic projections of the active layers of the driving transistors on the base substrate.

A display apparatus provided by embodiments of the present disclosure includes the print recognition module provided by the embodiments of the present disclosure, and a display panel on a side of the print recognition module.

In some embodiments, the display panel may be, for example, an electroluminescent display panel, that is, sub pixels of the display panel include electroluminescent devices. The electroluminescent device may be, for example, an organic light-emitting diode device or a quantum dot light-emitting diode device.

The display apparatus provided by the embodiments of the present disclosure may be: any product or component with a display function, such as a mobile phone, a tablet computer, a television, a displayer, a notebook computer, a digital photo frame, and a navigator. It should be understood by those ordinarily skilled in the art that the display apparatus should have other essential constituent parts, which is not repeated here and should not be regarded as limitation to the present disclosure. Implementation of the display apparatus may refer to the embodiments of the above print recognition module, and repetitions are omitted.

To sum up, according to the print recognition module, the preparation method thereof, and the display apparatus provided by the embodiments of the present disclosure, the connecting electrodes electrically connected to the first electrodes of the driving transistors are additionally arranged between the photoelectric conversion portions and the first insulating layer, the connecting electrodes come into contact with the photoelectric conversion portions, and the connecting electrodes are each equivalent to the bottom electrode of the photodiode. Moreover, in the case that the orthographic projections of the photoelectric conversion portions on the base substrate fall within the orthographic projections of the connecting electrodes on the base substrate, the surfaces of sides, close to the base substrate, of the photoelectric conversion portions all come into contact with the connecting electrodes, that is, there is no region of indirect contact between the photoelectric conversion portions and the connecting electrodes, thereby avoiding the loss of the electric field directly facing edges of the photoelectric conversion portions, reducing the difficulty of removing the carriers captured by the side wall defect of the photoelectric conversion portions, avoiding image residue, and further improving the accuracy of print recognition.

Although the preferred embodiments of the present disclosure have been described, those skilled in the art can make additional modifications and variations on these embodiments once they know the basic creative concept. Therefore, the appended claim intends to be explained as including the preferred embodiments and all modifications and variations falling within the scope of the present disclosure.

Apparently, those skilled in the art can make various modifications and variations to the embodiments of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A print recognition module, comprising:
a base substrate;
a driving circuit layer on a side of the base substrate, wherein the driving circuit layer comprises a plurality of driving transistors arranged in an array;
a first insulating layer on a side, facing away from the base substrate, of the driving circuit layer; wherein the first insulating layer comprises a plurality of first via holes running through a thickness of the first insulating layer;
a connecting electrode layer on a side, facing away from the driving circuit layer, of the first insulating layer; wherein the connecting electrode layer comprises a plurality of connecting electrodes which are in one-to-one correspondence with first electrodes of plurality of the driving transistors, and the plurality of connecting electrodes are electrically connected to the first electrodes of the plurality of driving transistors through the plurality of first via holes; and
a plurality of photoelectric conversion portions on a side, facing away from the first insulating layer, of the connecting electrode layer; wherein the plurality of photoelectric conversion portions are in correspondence with the plurality of connecting electrodes; orthographic projections of the plurality of photoelectric conversion portions on the base substrate fall within orthographic projections of the plurality of connecting electrodes on the base substrate; and surfaces of sides, close to the base substrate, of the plurality of photoelectric conversion portions all come into contact with the plurality of connecting electrodes;
wherein orthographic projections of the first electrodes of the plurality of driving transistors on the base substrate cover the orthographic projections of the plurality of connecting electrodes on the base substrate;
wherein the first electrodes of the plurality of driving transistors comprise: first parts and second parts connected with the first parts;
wherein the orthographic projections of the plurality of connecting electrodes on the base substrate fall within orthographic projections of the first parts on the base substrate;
patterns of the orthographic projections of the plurality of connecting electrodes on the base substrate are similar to patterns of the orthographic projections of the first parts on the base substrate; and
the orthographic projections of the plurality of connecting electrodes on the base substrate do not mutually overlap orthographic projections of the second parts on the base substrate.

2. The print recognition module according to claim 1, wherein the patterns of the orthographic projections of the plurality of connecting electrodes on the base substrate are each a rectangle with a missing corner.

3. The print recognition module according to claim 1, wherein patterns of the orthographic projections of the plurality of photoelectric conversion portions on the base substrate are similar to the patterns of the orthographic projections of the plurality of connecting electrodes on the base substrate.

4. The print recognition module according to claim 1, wherein orthographic projections of the plurality of first via holes on the base substrate fall within the orthographic projections of the plurality of photoelectric conversion portions on the base substrate.

5. The print recognition module according to claim 4, wherein patterns of the orthographic projections of the plurality of first via holes on the base substrate are similar to patterns of the orthographic projections of the plurality of photoelectric conversion portions on the base substrate.

6. The print recognition module according to claim 5, wherein a ratio of an area of the patterns of the orthographic projections of the plurality of first via holes on the base substrate to an area of the patterns of the orthographic projections of the plurality of photoelectric conversion portions on the base substrate ranges from 0.6:1 to 1:1.

7. The print recognition module according to claim 1, wherein the driving circuit layer specifically comprises:
a first conductive layer, comprising control electrodes of the plurality of driving transistors and a plurality of scanning signal lines;
a gate insulating layer on a side, facing away from the base substrate, of the first conductive layer;
an active layer on a side, facing away from the first conductive layer, of the gate insulating layer; and
a second conductive layer on a side, facing away from the gate insulating layer, of the active layer; wherein the second conductive layer comprises: the first electrodes and second electrodes of the plurality of driving transistors, and a plurality of data signal lines;
wherein the plurality of data signal lines and the plurality of scanning signal lines cross each other to divide into a plurality of print recognition units;
the first electrode of each of the plurality of driving transistors is located in a corresponding print recognition unit;
a minimum distance between an edge of an orthographic projection of the first electrode of each of the plurality of driving transistors on the base substrate and an edge of an orthographic projection of a corresponding scanning signal line on the base substrate is greater than or equal to 3 microns and less than or equal to 5 microns; and
a minimum distance between an edge of the orthographic projection of the first electrode of the each driving transistor on the base substrate and an edge of an orthographic projection of a corresponding data signal line on the base substrate is greater than or equal to 3 microns and less than or equal to 5 microns.

8. The print recognition module according to claim 7, wherein a minimum distance between an edge of the orthographic projection of each of the plurality of connecting electrodes on the base substrate and an edge of an orthographic projection of a corresponding scanning signal line on the base substrate is greater than or equal to 8 microns and less than or equal to 10 microns; and
a minimum distance between an edge of the orthographic projection of the each connecting electrode on the base substrate and an edge of an orthographic projection of a corresponding data signal line on the base substrate is greater than or equal to 8 microns and less than or equal to 10 microns.

9. The print recognition module according to claim 7, wherein in each of the plurality of print recognition units, the first via hole and the driving transistor are arranged oppositely in an extension direction of a diagonal line of the print recognition unit.

10. The print recognition module according to claim 7, wherein in each of the plurality of print recognition units, the first via hole and the driving transistor are arranged oppositely in an extension direction of the plurality of scanning signal lines.

11. The print recognition module according to claim 9, wherein a ratio of an area of orthographic projections of the plurality of first via holes on the base substrate to an area of the orthographic projections of the plurality of photoelectric conversion portions on the base substrate ranges from 0.005:1 to 0.05:1.

12. The print recognition module according to claim 1, wherein a ratio of an area of the orthographic projections of the plurality of connecting electrodes on the base substrate to an area of orthographic projections of the first electrodes of the plurality of driving transistors on the base substrate is 0.6:1 to 1:1.

13. The print recognition module according to claim 1, wherein a ratio of an area of the orthographic projections of the plurality of photoelectric conversion portions on the base substrate to an area of the orthographic projections of the plurality of connecting electrodes on the base substrate is 0.6:1 to 1:1.

14. The print recognition module according to claim 1, further comprising:
- a first buffer layer on sides, facing away from the connecting electrode layer, of the plurality of photoelectric conversion portions;
- a planarization layer on a side, facing away from the plurality of photoelectric conversion portions, of the first buffer layer;
- a second buffer layer on a side, facing away from the first buffer layer, of the planarization layer;
- a third conductive layer on a side, facing away from the planarization layer, of the second buffer layer; wherein the third conductive layer comes into contact with the plurality of photoelectric conversion portions through a plurality of second via holes running through the second buffer layer, the planarization layer, and the first buffer layer;
- a second insulating layer on a side, facing away from the second buffer layer, of the third conductive layer;
- a light-shading metal layer on a side, facing away from the third conductive layer, of the second insulating layer; wherein an orthographic projection of the light-shading metal layer on the base substrate covers orthographic projections of active layers of the plurality of driving transistors on the base substrate;
- a third insulating layer on a side, facing away from the second insulating layer, of the light-shading metal layer; wherein the third insulating layer has a third via hole running through a thickness of the third insulating layer; and
- a shielding layer on a side, facing away from the light-shading metal layer, of the third insulating layer, wherein the shielding layer comes into contact with the light-shading metal layer through the third via hole.

15. The print recognition module according to claim 14, wherein the plurality of second via holes completely expose surfaces of sides, facing away from the plurality of connecting electrodes, of the plurality of photoelectric conversion portions.

16. A display apparatus, comprising the print recognition module according to claim 1, and a display panel on a side of the print recognition module.

* * * * *